United States Patent
Abe et al.

(10) Patent No.: US 8,284,350 B2
(45) Date of Patent: Oct. 9, 2012

(54) LIGHTING SYSTEM AND LIQUID CRYSTAL DISPLAY USING THE SAME

(75) Inventors: Makoto Abe, Hitachiota (JP); Akitoyo Konno, Hitachi (JP); Kaoru Katayama, Hadano (JP); Takeshi Miitsu, Isehara (JP)

(73) Assignee: Hitachi, Ltd., Tokyo (JP)

( * ) Notice: Subject to any disclaimer, the term of this patent is extended or adjusted under 35 U.S.C. 154(b) by 1157 days.

(21) Appl. No.: 12/120,358

(22) Filed: May 14, 2008

(65) Prior Publication Data

US 2008/0284946 A1   Nov. 20, 2008

(30) Foreign Application Priority Data

May 15, 2007 (JP) ................... 2007-128759

(51) Int. Cl.
*G02F 1/1335* (2006.01)
(52) U.S. Cl. .......................................... 349/68; 349/61
(58) Field of Classification Search ............... 349/61–71
See application file for complete search history.

(56) References Cited

U.S. PATENT DOCUMENTS

| | | | | |
|---|---|---|---|---|
| 7,651,234 B2 * | 1/2010 | Lim | ............ | 362/97.3 |
| 2006/0092634 A1 | 5/2006 | Hiyama et al. | | |
| 2006/0214174 A1 * | 9/2006 | Shirakuma et al. | ............ | 257/89 |
| 2007/0153159 A1 * | 7/2007 | Jung | ............ | 349/69 |

FOREIGN PATENT DOCUMENTS

| | | |
|---|---|---|
| JP | 9-148633 | 6/1997 |
| JP | 2006-134992 | 5/2006 |

* cited by examiner

*Primary Examiner* — Richard Kim
*Assistant Examiner* — David Chung
(74) *Attorney, Agent, or Firm* — Antonelli, Terry, Stout & Kraus, LLP.

(57) ABSTRACT

A lighting system has light-emitting diodes as light sources mounted on a circuit board, in which the light-emitting diodes include a red light-emitting diode, blue light-emitting diode and a green light-emitting diode, the light-emitting diodes are constituted of one single unit including one for each of the red, blue and green light-emitting diodes, and the one single unit is repeatedly arranged as plural pieces on the same circuit board, and each of the red, blue and green light-emitting diodes is individually connected electrically to emit a light.

16 Claims, 12 Drawing Sheets

CONCEPTUAL SECTION DIAGRAM INDICATED BY THE ARROWS A-A IN FIG.1A

SECTION VIEW INDICATED BY THE ARROWS B-B IN FIG.3A

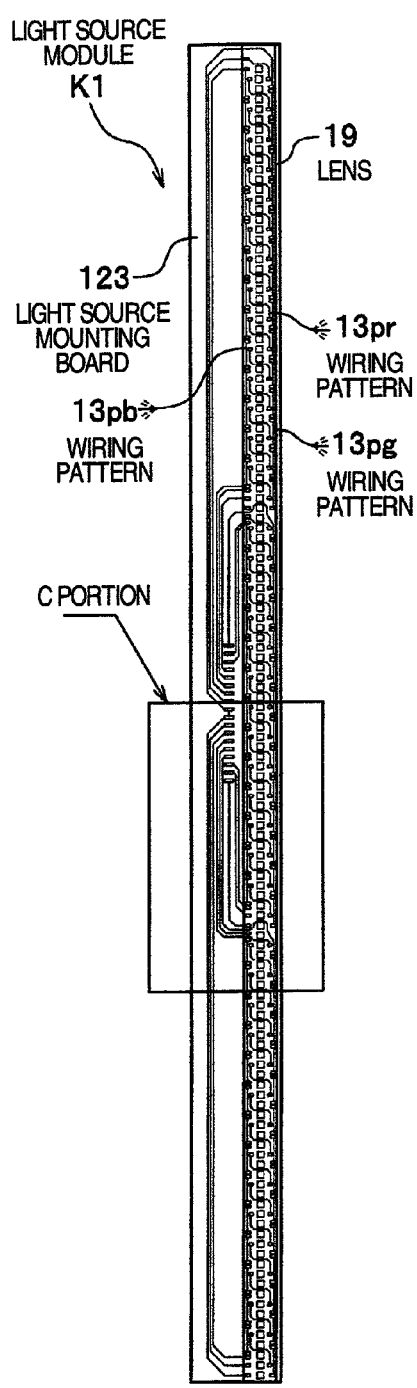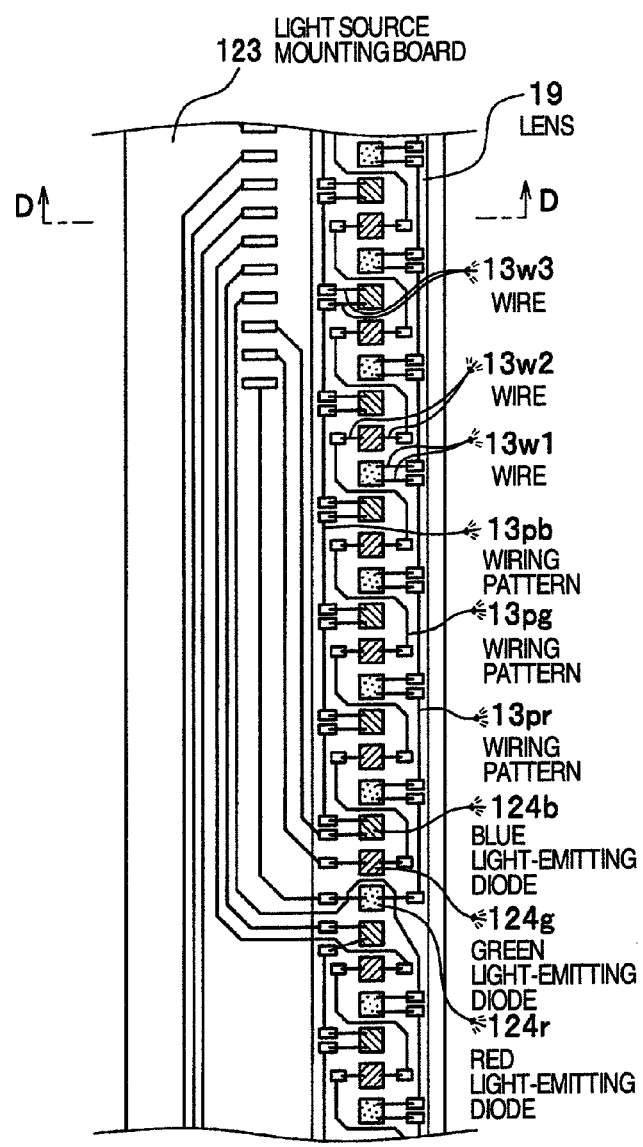
FIG.6A
FIG.6B
ENLARGED VIEW OF C PORTION IN FIG.6A

ENLARGED VIEW OF E PORTION IN FIG.9A

ENLARGED VIEW OF F PORTION IN FIG.10A

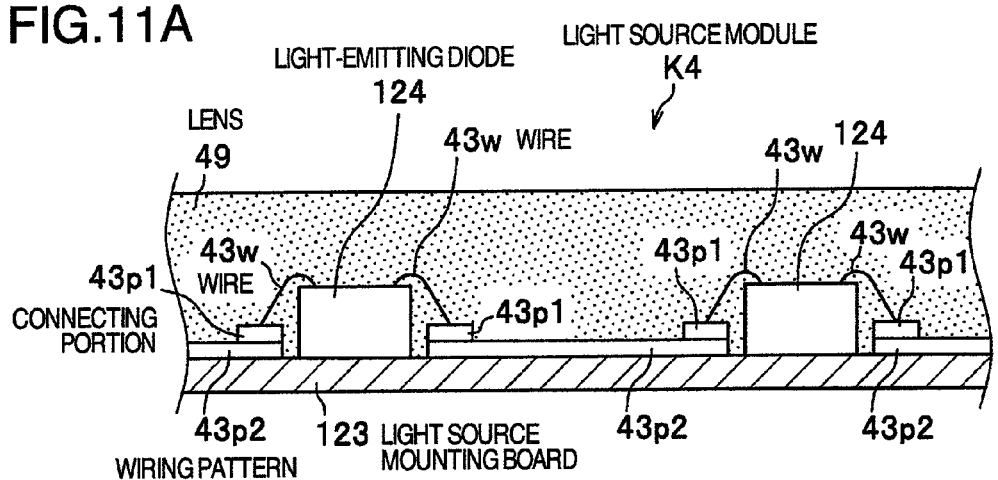
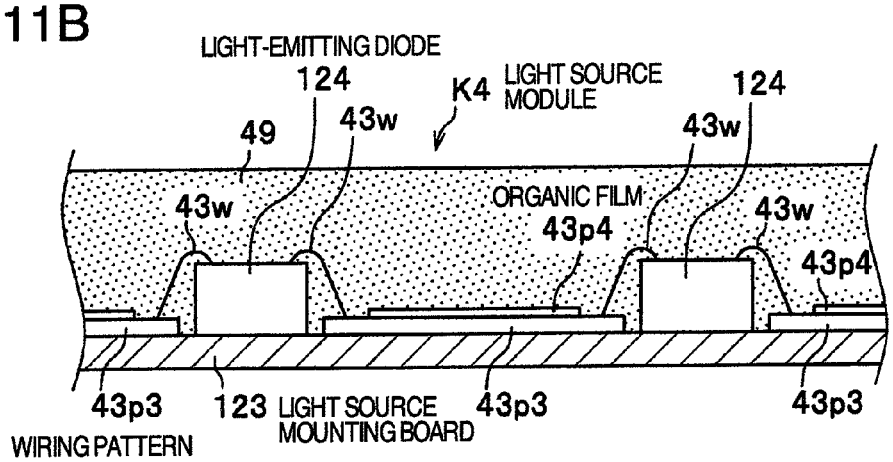
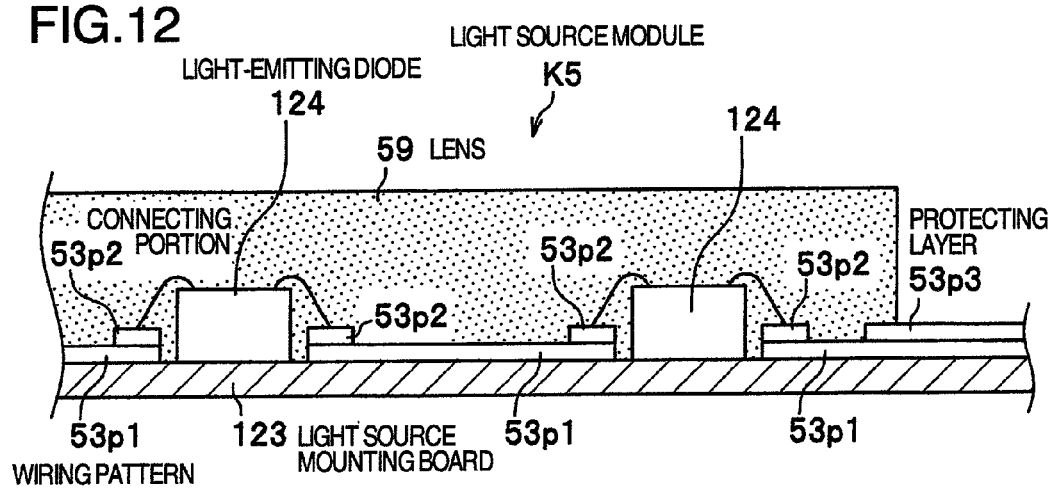

LIGHTING SYSTEM AND LIQUID CRYSTAL DISPLAY USING THE SAME

BACKGROUND OF THE INVENTION

The present invention relates to a lighting system and a liquid crystal display using the lighting system, which is used for televisions, personal computers, etc.

In these years, the liquid crystal display widely used for the televisions, personal computers, etc. has a major feature such that its size of depth is small, or a thin type as a flat panel display, in comparison with a cathode-ray tube display device which is known as emitted an electron ray.

For a purpose of further applying the feature of thin type, the liquid crystal display uses a backlight system in which a light source is arranged on the rear of screen, in the past, to transmit a light through a liquid crystal portion to be controlled by a voltage. In these days, the liquid crystal display has also employed a sidelight-type backlight system in which a light source is arranged on the both sides of a screen to reflect diffusely the light from the both side light sources and to lead the light as a surface light source from the rear of liquid crystal portion by using a light guide plate.

For example, JP-A-9-148633 (referring to paragraph numbers 0018 to 0020, 0024, 0025, FIG. 1, and FIG. 2) discloses a technique with a printed-circuit board forming an electrical conductive circuit, a plurality of light-emitting diode chips arranged linearly on a predetermined location of the electrical conductive circuit, a pair of white-based resin bodies formed on both sides thereof in parallel, and a transparent resin body to seal the light-emitting diode chips arranged linearly between the white-based resin bodies. In this way, the light emitted from the light-emitting diode chip is reflected by the white-based resin body and is focused on an optical axis of the light source, enhancing usability of the light.

Incidentally, the JP-A-9-148633 uses a white light-emitting diode as a light source, therefore, there is a problem that a color purity cannot be made high since a color of display screen is produced by a color filter alone, which is arranged in parallel and overlapped with the liquid crystal portion.

Further, since the light sources are arranged on the sides, it is difficult that the light emitted from the light-emitting diode of the light source is turned into a light to be transmitted through the liquid crystal portion perpendicular to a transmitted light direction, after the emitted light from the light-emitting diode is transmitted with a less loss through the transparent resin body covered on the light-emitting diodes. Therefore, it is desirable that the light emitted from the light-emitting diode of the light source is led to the liquid crystal portion with the less loss. Further, in the case where the light-emitting diode chip is mounted by a flip-chip connection with the electrical conductive circuit on the printed circuit board, it is necessary to provide an expensive production line for enhancing accuracy because of using a sputtering, photolithograph, etc.

In addition, in the case where an electrical conductive pattern on the printed circuit board is long for connections of the mounted light-emitting diode chips, an occupied area on the printed circuit board becomes broaden. A tendency not to effectively use the light from the light source causes due to a low light reflectance of the electrical conductive pattern since the light reflectance of the conductive pattern is low.

SUMMARY OF THE INVENTION

In light of the above description, an object of the invention is to provide a lighting system and a liquid crystal display using the lighting system to be able to output vivid colors, enhance a luminance of a light source, and realize a low cost and high quality.

In order to achieve the foregoing object, the lighting system in relation to the invention has light-emitting diodes as light sources mounted on a circuit board, in which the light-emitting diodes include a red light-emitting diode, a blue light-emitting diode and a green light-emitting diode, the light-emitting diodes are constituted of one single unit including one for each of the red, blue and green light-emitting diodes, and the one single unit is repeatedly arranged as plural pieces on the same circuit board, and each of the red, blue and green light-emitting diodes is individually connected electrically to emit a light.

Further, the liquid crystal display in relation to the invention includes a liquid crystal panel which displays an image; and a lighting system having light-emitting diodes as light sources mounted on a circuit board, in which the light-emitting diodes include a red light-emitting diode, a blue light-emitting diode and a green light-emitting diode, the light-emitting diodes are constituted of one single unit including one for each of the red, blue and green light-emitting diodes, and the one single unit is repeatedly arranged as plural pieces, and each of the red, blue and green light-emitting diodes is individually connected electrically to emit a light.

According to the lighting system or liquid crystal display in the invention, it is possible to realize the lighting system and the liquid crystal display using the lighting system which outputs vivid colors, enhances the luminance of light source, and realizes the low cost and high quality.

The other objects and methods of achieving the objects will be readily understood in conjunction with the description of embodiments of the present invention and the drawings.

BRIEF DESCRIPTION OF THE DRAWINGS

FIG. 6A is an upper surface conceptual diagram seeing the light source module of the first embodiment in FIG. 3A from an upside;

FIG. 6B is an enlarged view of C portion in FIG. 6A;

FIGS. 11A to 11B are conceptual section diagrams showing connections between the light-emitting diodes in a fourth embodiment and the wiring patterns formed on the light source mounting board;

FIG. 12 is a conceptual section diagram showing connections between the wiring patterns formed on the light source mounting board in a fifth embodiment and the light-emitting diodes.

DETAILED DESCRIPTION OF THE EMBODIMENTS

Hereinafter, embodiments of the invention will be described with reference to the drawings.

Figure 1A:
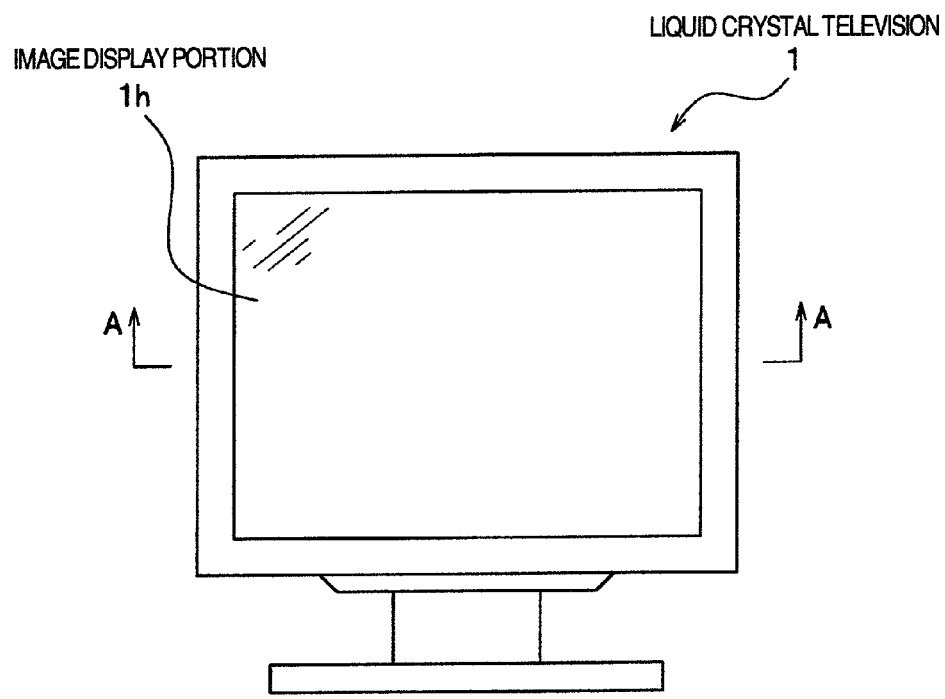
FIG. 1A is a front surface view of a liquid crystal television in an embodiment of the invention.
Figure 1B:
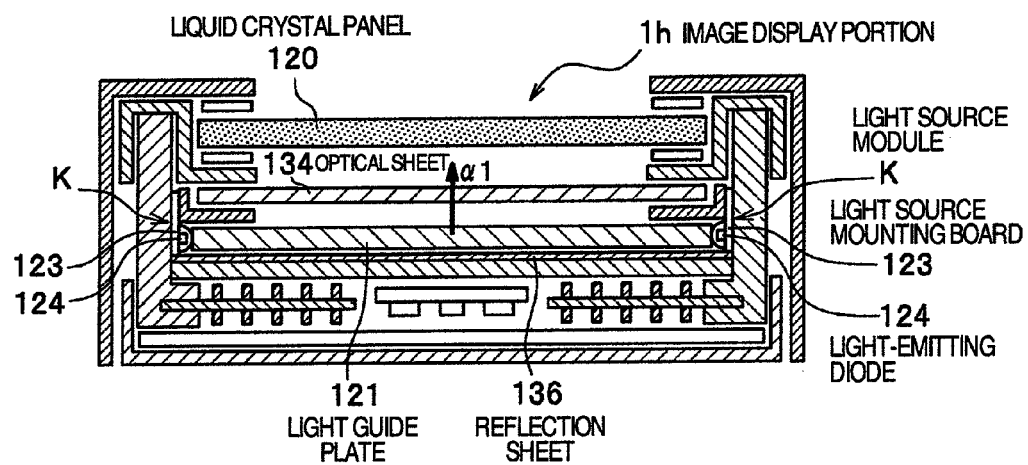
FIG. 1B is a conceptual section diagram indicated by the arrows A-A in FIG. 1A.
Figure 2A:
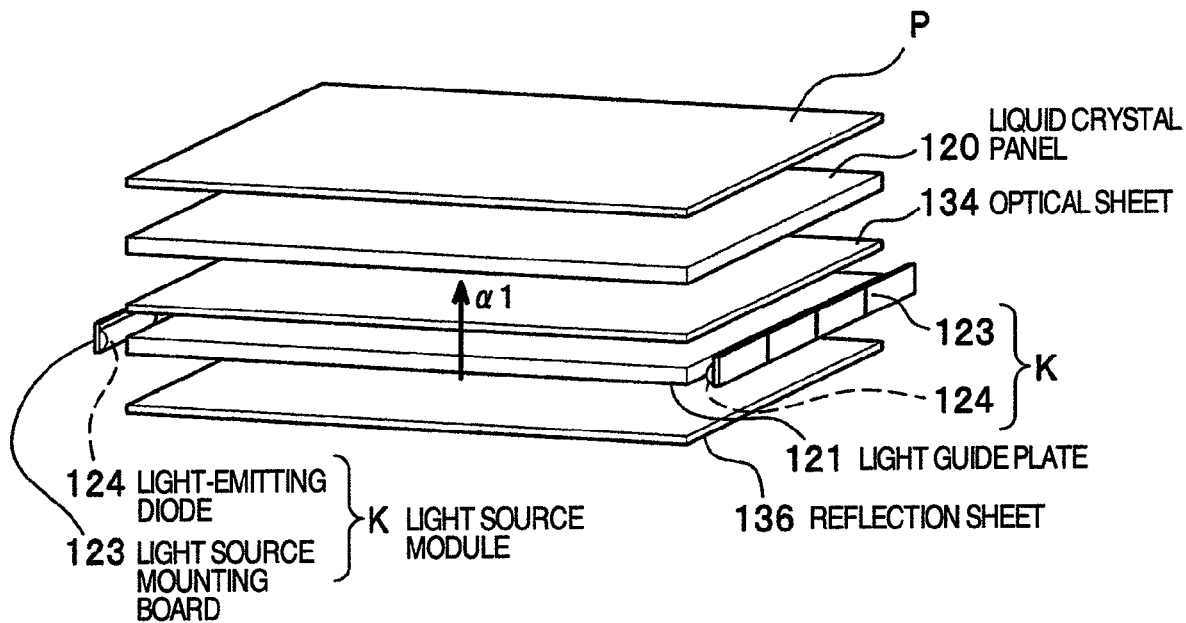
FIG. 2A is a perspective view seeing an exploded condition of an image display portion 1h shown in FIG. 1B from an upside obliquely.

A liquid crystal television (liquid crystal display) 1 using the present invention has an image display portion 1h in FIG. 1A showing a front surface view thereof. In the image display portion 1h, a light transmitted from a rear of the liquid crystal which is applied by a voltage is irradiated on individual pixels of color filters to display colors for the respective pixels and to display an image. In addition, FIG. 1B is a conceptual section diagram indicated by the arrows A-A shown in FIG. 1A. FIG. 2A is a perspective view seeing an exploded condition of the image display portion 1h in FIG. 1B from an upside obliquely.

As shown in FIG. 1B and FIG. 2A, the image display portion 1h is constituted by a liquid crystal panel 120 which displays an image by transmitting a light from the rear of the liquid crystal and a color filter, applied by a voltage in response to an image and by making colors output from the respective pixels; light source mounting boards (circuit board) 123 which are arranged on both side portions on which light-emitting diodes (LED) 124, as a light source of the light to be transmitted through the liquid crystal panel 120, are mounted; a light guide plate 121 which brings the light from the light-emitting diodes 124 on the both sides to diffuse and guide the light to a forward as indicated by an arrow α1; a reflection sheet 136 which is arranged on a rear surface side (lower side in FIG. 1B) of the light guide plate 121 and reflects diffusely the light that deviates to the rear surface side of the light guide plate 121 to be turned into the light directed to the forward (arrow α1); and an optical sheet 134 which turns the light transmitted through the light guide plate 121 used for such a light reflected by the reflection sheet 136 into a uniform light directed to the forward (arrow α1). In addition, FIG. 1B omits a transparent front surface panel P (referring to FIG. 2A) to be arranged on an outside of the liquid crystal panel 120.

Figure 2B:
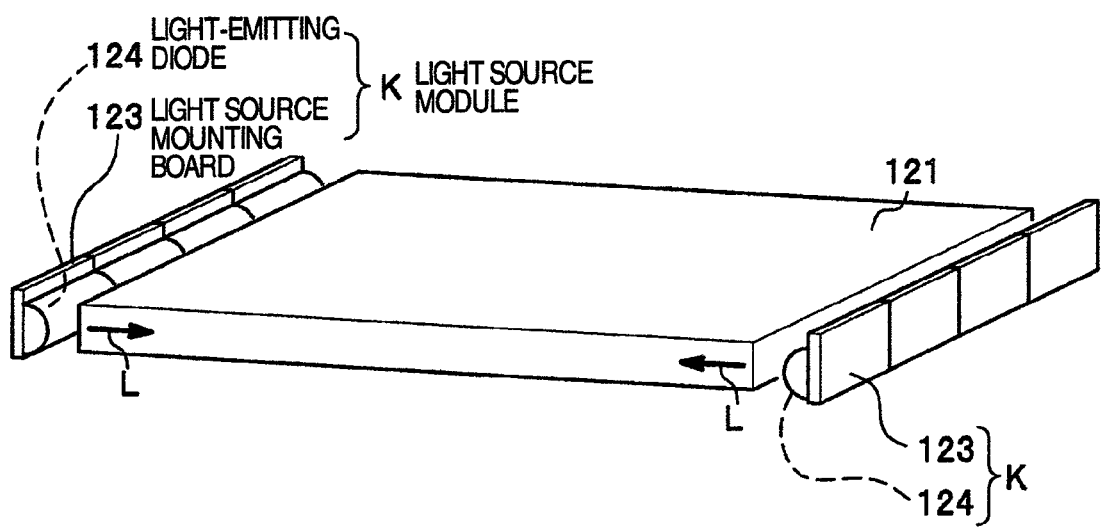
FIG. 2B is a perspective view showing a light source mounting board and a light guide plate on which light-emitting diodes are mounted in the exploded condition of the image display portion shown in FIG. 2A.

FIG. 2B is a perspective view showing the light source mounting boards 123 and light guide plate 121 on which the predetermined number of the light-emitting diodes 124 (124r, 124g, 124b) are mounted in the exploded view of FIG. 2A. As shown in FIG. 2B, the light source mounting boards 123, on which the predetermined number of light-emitting diodes 124 is mounted respectively, are arranged dividedly into four sections on the light guide plate 121 in a bilaterally-symmetric manner.

In addition, the light-emitting diodes 124, 124 . . . and the light source mounting board 123, . . . , these of which are arranged on the both bilateral sides of the light guide plate 121, are referred to as a light source module (lighting system) K(K1, K2, . . . K6).

In addition, the following embodiments 1 to 6 will be described with the light-emitting diode 124 and light source mounting board 123 as the same reference numerals, and other reference numerals will be applied to new constitutional elements.

Embodiment 1

Figure 3A:
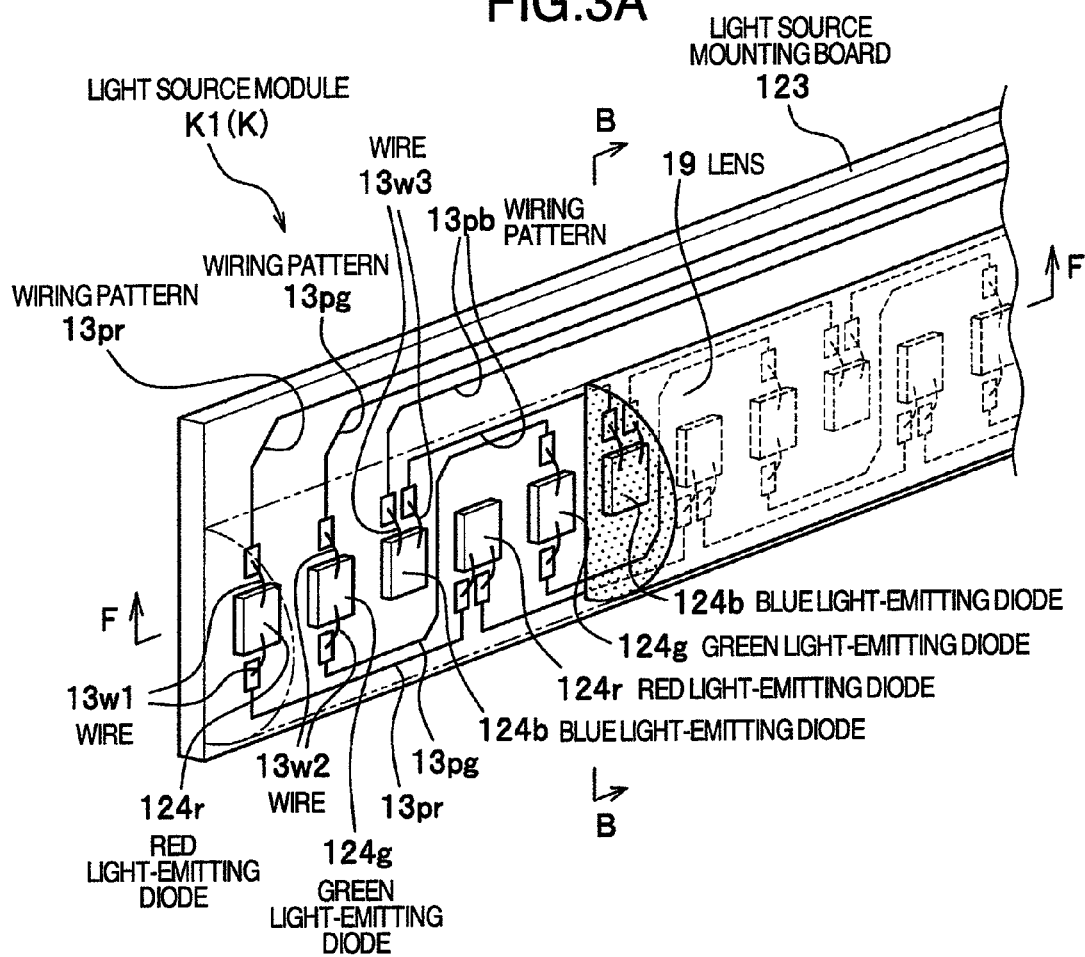
FIG. 3A is a perspective view showing details of a light source module containing the light source mounting board on which the light-emitting diodes are mounted in the liquid crystal display of a first embodiment in the invention.
Figure 3B:
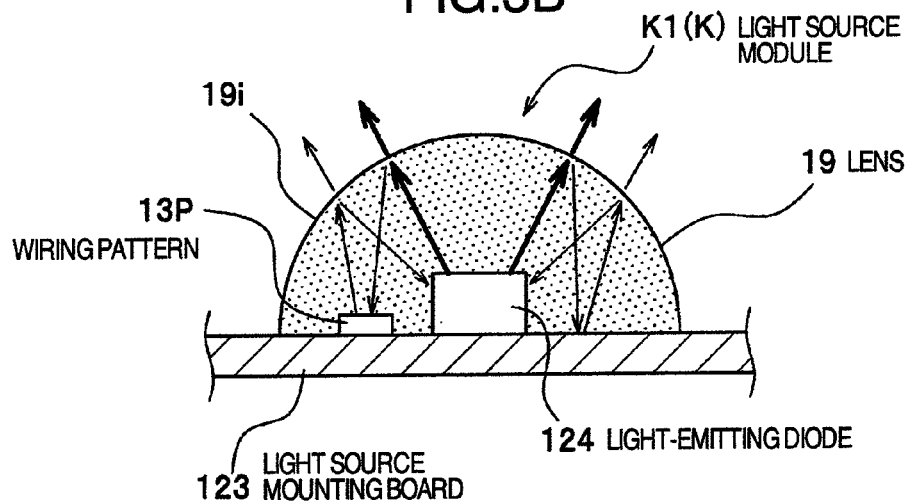
FIG. 3B is a section view indicated by the arrows B-B in FIG. 3A.

Next, a light source module K1 of the liquid crystal television 1 in a first embodiment will be described with use of FIGS. 3A and 3B. In this case, FIG. 3A is a perspective view showing details of the light source module K1 of the liquid crystal television 1 in the first embodiment of the invention. FIG. 3B is a section view indicated by the arrows B-B shown in FIG. 3A.

Figure 4:
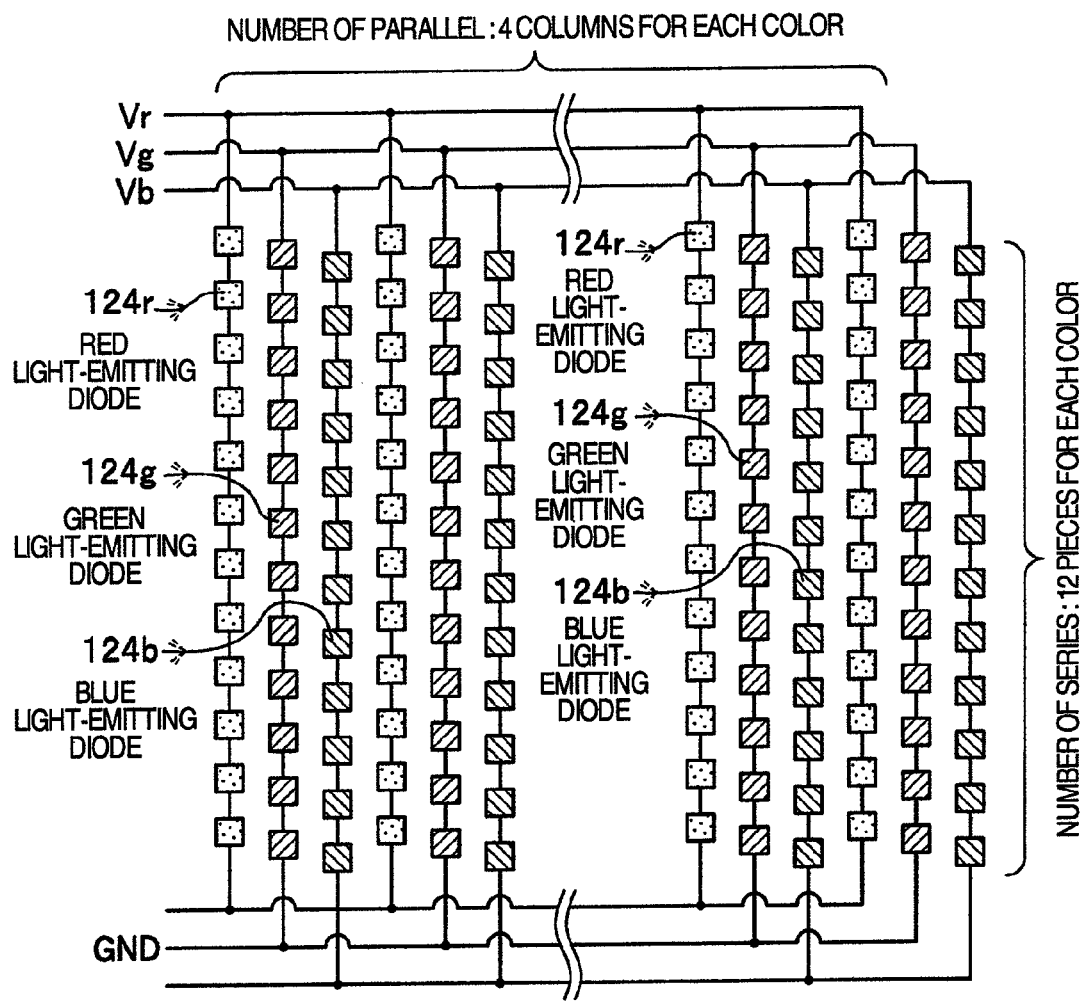
FIG. 4 is a schematic diagram showing connections between the light-emitting diodes mounted on the light source mounting board in the first embodiment.

As shown in FIG. 3A, in the first embodiment, three light-emitting diodes are set to one single unit, that is, a plurality of red light-emitting diodes 124r, green light-emitting diodes 124g and blue light-emitting diodes 124b are repeatedly mounted linearly on the light source mounting board 123, respectively, as light sources. Here, the red light-emitting diodes 124r on the light source mounting boards 123 are connected with a wiring pattern 13pr printed on the light source mounting board 123 by a wire bonding using a wire 13w1. As shown in FIG. 4 of a schematic diagram indicating a connection between the light-emitting diodes, the red light-emitting diodes 124r are connected in series.

Likewise, the green light-emitting diode 124g are connected with a wiring pattern 13pg printed on the light source mounting board 123 by the wire bonding using a wire 13w2. As shown in FIG. 4, the green light-emitting diodes 124g are connected in series.

Likewise, the blue light-emitting diodes 124b are connected with a wiring pattern 13pb printed on the light source mounting board 123 by the wire bonding using a wire 13w3. As shown in FIG. 4, the blue light-emitting diodes 124b are connected in series.

FIG. 4 shows a constitutional example such that 12 pieces of the light-emitting diodes 124 connected in series are set to one group for each of the colors, and voltages Vr, Vg and Vb are applied to the groups, respectively. Four groups for each of the light-emitting diodes 124r, 124g and 124b are connected respectively to the voltages in parallel.

Here, preferably, the number of light-emitting diodes 124 corrected in series may be determined so that power source voltages to be supplied to the circuit board, such as 5, 12, 24 volts, are equal to a voltage for driving the liquid crystal display. Consequently, it is unnecessary to provide a DC/DC converter for supplying a constant voltage to each group of the light-emitting diodes, so that the number of components on the circuit board can be reduced. In this regard, it is difficult to match the voltage of all of the light-emitting diodes 124 with 5, 12 and 24 volts, since a drive voltage is different for each of the red light-emitting diode 124r, green light-emitting diode 124g, and blue light-emitting diode 124b. In this case, it is desirable that the drive voltage of either one or two colors of the light-emitting diode 124 is set to power source voltages such as 5, 12 or 24 volts.

As shown in FIGS. 3A and 3B, for a purpose of focusing the emitted light, the light-emitting diodes 124r, 124g and 124b mounted on the light source mounting board 123 are sealed by a transparent resin having a half cylindrical shape extended in a mounting direction, for example, a silicon-based resin lens (lens body) 19. In addition, FIG. 3A shows the lens 19 partially cut away thereof. According to the foregoing constitution, when a current is flown into the light-emitting diodes 124 to emit a light, as shown in FIG. 3B, the light come at the peripheral surface of lens is incident partially in an outward direction from the lens 19 and another partially remained light is reflected and propagated into the lens 19 in accordance with a refractive index difference between the lens 19 and the outward direction of the lens 19. Further, the light incident at an angle exceeded over a total reflection angle defined by the refractive index difference between the lens 19 and the outward direction of the lens 19, becomes a reflection light totally reflected by a peripheral surface 19i of the lens 19 to be propagated into the lens 19 in accordance with Snell's law.

These reflection lights then become newly reflected lights reflected by the surface of the light source mounting board 123, the surface of the wiring pattern 13p (13pr, 13pg, 13pb), etc. Of the reflection lights, a light come at the peripheral surface of lens is partially incident in the outward direction of the lens 19 by the refractive index difference between the lens 19 and the outward direction of the lens 19, and a partially remained light is reflected and propagated into the lens 19. Further, the light incident at the angle exceeded over the total reflection angle defined by the refractive index difference between the lens 19 and the outward direction of the lens 19 is totally reflected by the peripheral surface 19i of the lens 19 to become the reflection light and to be propagated into the lens 19 in accordance with Snell's law. In this way, the light emitted from the light-emitting diodes 124 are reflected repeatedly by the lens 19, the surface of light source mounting board 123, wiring pattern 13p, etc. to be incident in the outside of lens 19. In addition, the light from the light-emitting diode 124 is subject to an effect of refractive index of the lens 19 and air, and propagates forward.

Therefore, since a high-low of reflectance of the light source mounting board 123, wiring pattern 13p, etc. is directly related to a high-low of an irradiation performance for the light source module K1, it is therefore desirable to use the light source mounting board 123 having a high reflectance, and it is also desirable to use a wiring layout having a less occupied area of the wiring pattern 13p etc.

Figure 5:
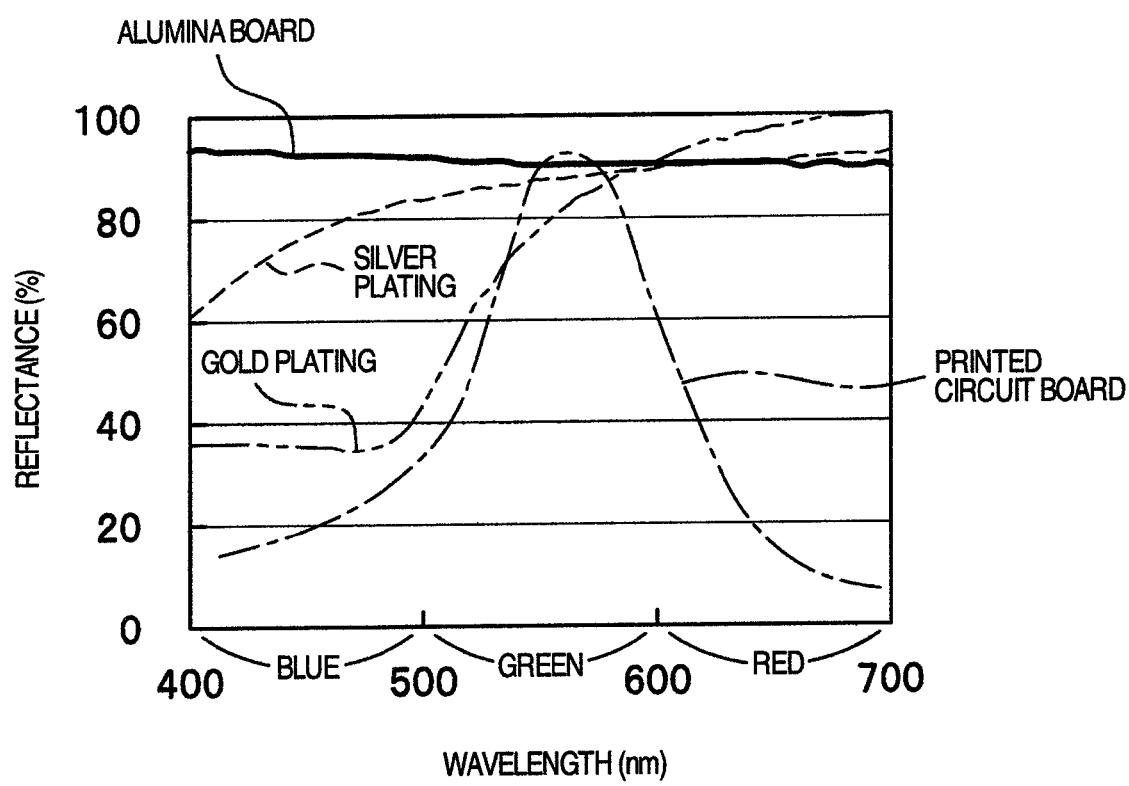
FIG. 5 is a diagram showing reflectance responsive to lights of blue, green and red relative to a printed circuit board, an alumina board, and a gold and silver used as a wiring pattern.

FIG. 5 is a diagram showing reflectance responsive to lights of blue, green and red of the light-emitting diodes 124 relative to a printed circuit board, an alumina board, and gold and silver used for as the wiring pattern, in which the abscissa axis indicates light wavelength (nm) and the ordinate axis indicates reflectance (%). Here, a blue light has a wavelength about 400 to 500 nm, a green light has about 500 to 600 nm, and a red light has about 600 to 700 nm.

According to FIG. 5, the printed circuit board has a high reflectance responsive to the green light, but a low reflectance responsive to the blue and red lights. In contrast, the alumina board has the high reflectance responsive to either the blue, green or red light.

Further, gold used for the wiring pattern has the high reflectance responsive to the red light and green light having a long wavelength, but has the low reflectance responsive to the green and blue lights having a short wavelength. On the contrary, silver used for the wiring pattern has the high reflectance responsive to either the blue, green or red light. Referring to FIG. 5, the alumina board has the higher reflectance than that of either silver, gold used for the wiring pattern, or the printed circuit board.

Consequently, the light source mounting board 123 in the first embodiment uses the alumina board having the high reflectance responsive to either the red, blue or green light. The wiring pattern 13p employs sliver having the high reflectance. In addition, as is apparent from FIG. 5, an occupied area of the alumina board having the higher reflectance than the silver wiring pattern 13p is increased so that the light source module K1 having the higher reflectance can be obtained, enhancing a luminance as a light source.

FIG. 6A is an upper surface conceptual diagram seeing the light source module K1 in FIG. 3A from an upside. FIG. 6B is an enlarged view of C portion in FIG. 6A, and shows the wiring pattern to be connected with the respective light-emitting diodes 124.

As shown in FIGS. 6A and 6B, the wiring pattern (wiring pattern defined in claim 2) 13pr to be connected with the red light-emitting diodes 124r is formed linearly along one side in the half cylindrical shape lens 19 extended in a longitudinal direction. The red light-emitting diodes 124r are then wire-bonded with the wiring pattern 13pr using the wire 13w1, and the predetermined number of red light-emitting diodes 124r are connected in series. Further, the wiring pattern (wiring pattern defined in claim 2) 13pb to be connected with the blue light-emitting diodes 124b is formed linearly along the other side in the half cylindrical shape lens 19 extended in the longitudinal direction. The blue light-emitting diodes 124b are then wire-bonded with the wiring pattern 13pb using the wire 13w3, and the predetermined number of blue light-emitting diodes 124b are connected in series.

On the other hand, the wiring pattern 13pg to be connected with the green light-emitting diodes 124g is formed and passed-through between the mounted red light-emitting diodes 124r and blue light-emitting diodes 124b. The green light-emitting diodes 124g are then wire-bonded with the wiring pattern 13pg using the wire 13w2, and the predetermined number of green light-emitting diodes 124g are connected in series.

In this way, the wiring pattern 13pr connected with the red light-emitting diodes 124r and the wiring pattern 13pb connected with the blue light-emitting diodes 124b are formed linearly so that the occupied area of the wiring pattern 13p formed in the lens 19 can be reduced, and the occupied area of the light source mounting board 123 made of the alumina board having the high reflectance can be increased.

Figure 7:
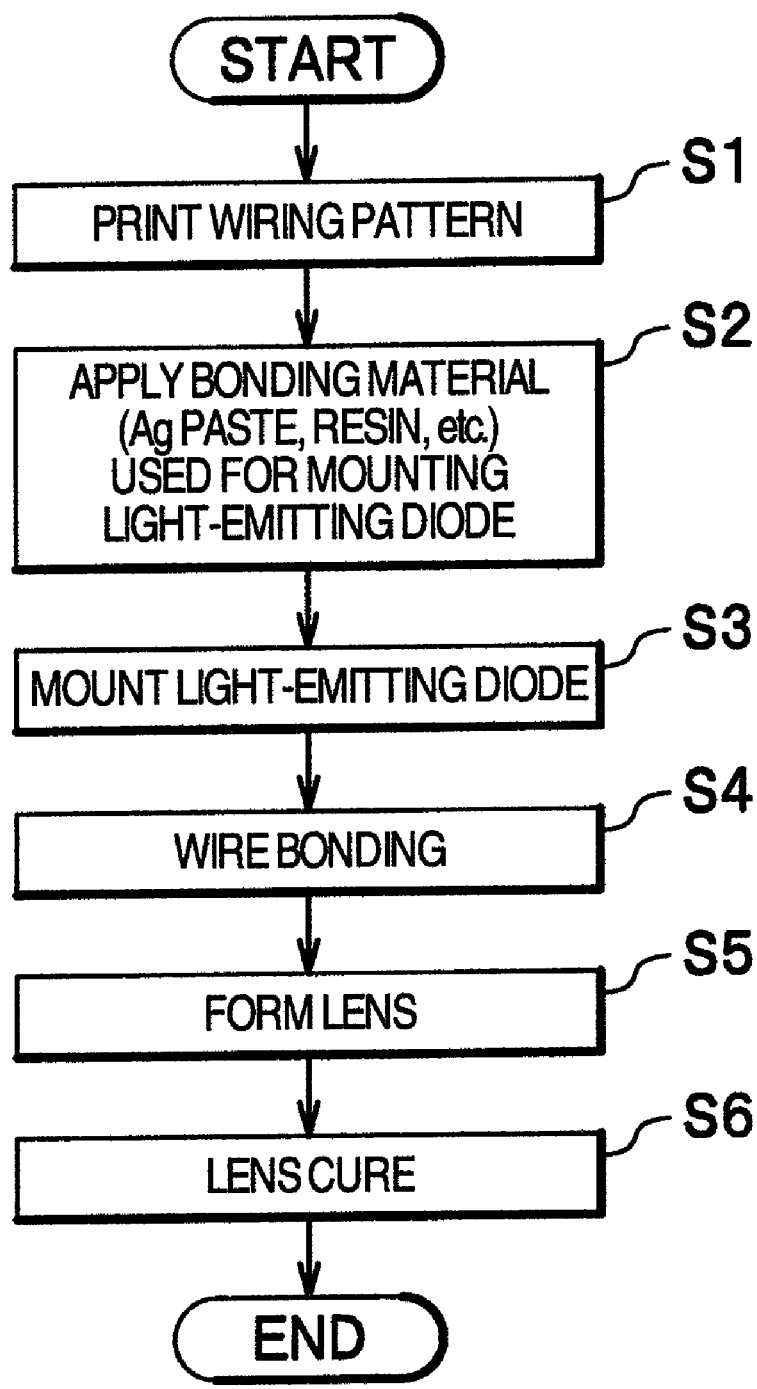
FIG. 7 is a flowchart showing a process of forming the light source module in the first embodiment.

Next, the following description will be concerned with a manufacturing method of the light source module K1 in which the light-emitting diodes 124 mounted on the light source mounting board 123 is sealed by the lens 19 using a resin, with use of FIG. 7 and FIGS. 8A to 8E. In addition, FIG. 7 is a flowchart of forming the light source module K1. FIGS. 8A to 8E are conceptual diagrams indicated by the arrows D-D in FIG. 6B and showing the process of forming the light source module K1.

Figure 8A:
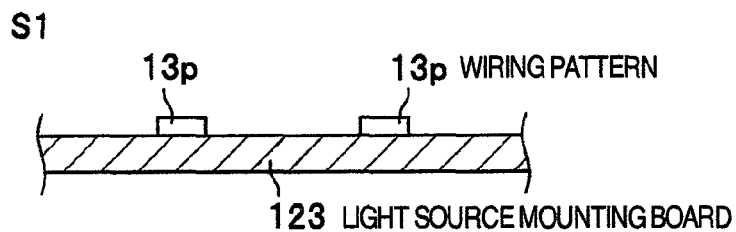
FIGS. 8A to 8E are conceptual diagrams indicated by the arrows D-D in FIG. 6B and showing the process of forming the light source module in the first embodiment.
Figure 8B:
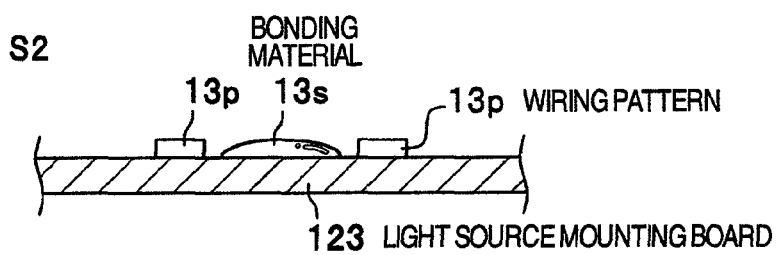
Figure 8C:
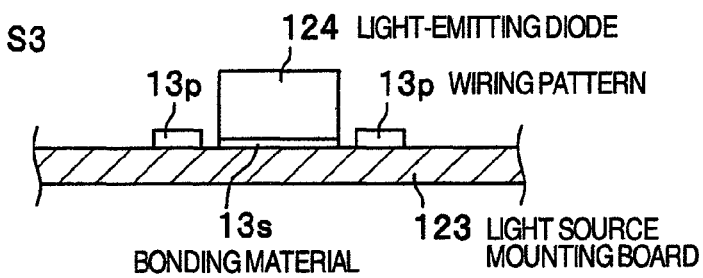

First, as shown in FIG. 8A, the wiring pattern 13p of silver is printed on the light source mounting board 123 made of the alumina board which is formed of a predetermined shape (S1 in FIG. 7). Subsequently, as shown in FIG. 8B, a bonding material 13s such as a silver paste and a resin used for mounting the LED is applied to a predetermined location on which the light-emitting diodes 124 are mounted (S2 in FIG. 7). As shown in FIG. 8C, the light-emitting diodes 124 are then mounted on the bonding material 13s applied to the light source mounting board 123, thereafter, the bonding material 13s is solidified and the light-emitting diodes 124 are mounted on the light source mounting board 123 (S3 in FIG. 7).

Figure 8D:
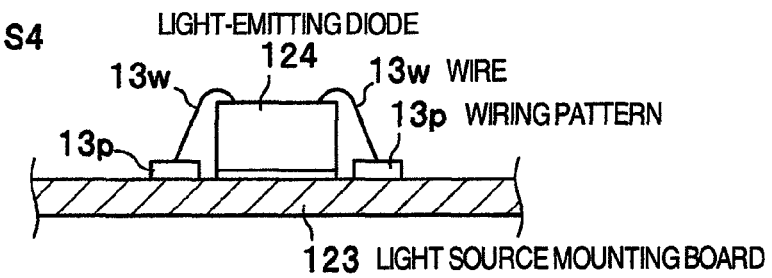
Figure 8E:
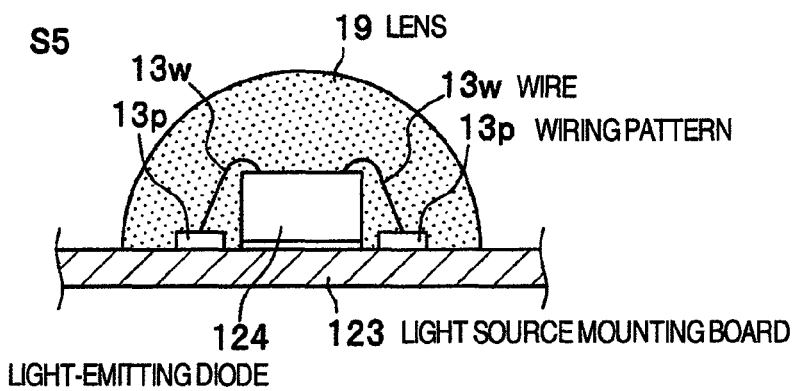

Subsequently, as shown in FIG. 8D, the light-emitting diodes 124 are wire-bonded with the wiring pattern 13p printed on the light source mounting board 123 by using the wire 13w (13w1, 13w2, 13w3) (S4 in FIG. 7). A liquid transparent resin material, for example, a silicon-based resin is then run into a hollow groove by using a jig (not shown) forming the hollow groove with the half cylindrical shape of the lens 19. The light-emitting diodes 124 mounted on the light source mounting board 123 are overlaid with the jig of the hollow groove containing the resin material. The light-emitting diodes 124 mounted on the light source mounting board 123 are sealed by the resin material to form a lens as shown in FIG. 8E (S5 in FIG. 7). The resin material is baked and solidified by a process of a lens cure, and the light-emitting diodes 124b mounted on the light source mounting board 123 are sealed by the lens 19 using the resin (S6 in FIG. 7) to thereby complete the light source module K1.

According to the foregoing first embodiment, the red, blue and green light-emitting diodes 124 of the three primary colors are used as the light source module K1, so that it is possible to add arbitrary colors to a backlight, and it is also possible to enhance a color purity of the image to be displayed on the image display portion 1h (referring to FIG. 1A).

Further, if the light-emitting diodes 124 are connected in series with each color of the light-emitting diodes of the red, blue, green, etc. and the number of serially connected light-emitting diodes 124 is determined so that a voltage to be applied to the serially connected diodes becomes equal to a power source voltage, it is therefore unnecessary to use a DC/DC converter for supplying a constant voltage to the light-emitting diodes 124, reducing the number of components on the circuit board.

As shown in FIG. 6B, the wirings can be intersected three-dimensionally with each other, therefore, a form of the wiring patterns 13p can be realized with a single wiring layer since the light-emitting diodes 124 are wire-bonded with the wiring patterns 13p. In addition, the wiring patterns 13p of the light-emitting diodes 124 are formed linearly so that the length of wiring patterns 13p, the reflectance of which is not high as shown in FIG. 5, can be made shortest, therefore, the occupied area thereof can be reduced. The occupied area of the light source mounting board 123 made of the alumina board having the high reflectance is also increased so that the reflectance of the light source mounting board 123 can be enhanced. In this way, the light from the light-emitting diodes 124 can be used effectively, therefore, it is possible to enhance the luminance of the light source module K1. It is thus possible to enhance the performance and reliability and to make a low cost.

In addition, the first embodiment has been described with an example where the light-emitting diodes 124 are connected in series with each color of the light-emitting diodes for red, blue, green, etc. However, respective the light-emitting diodes for each of the colors may simply be connected electrically, but it is not limited to connect them in series.

Embodiment 2

Figure 9A:
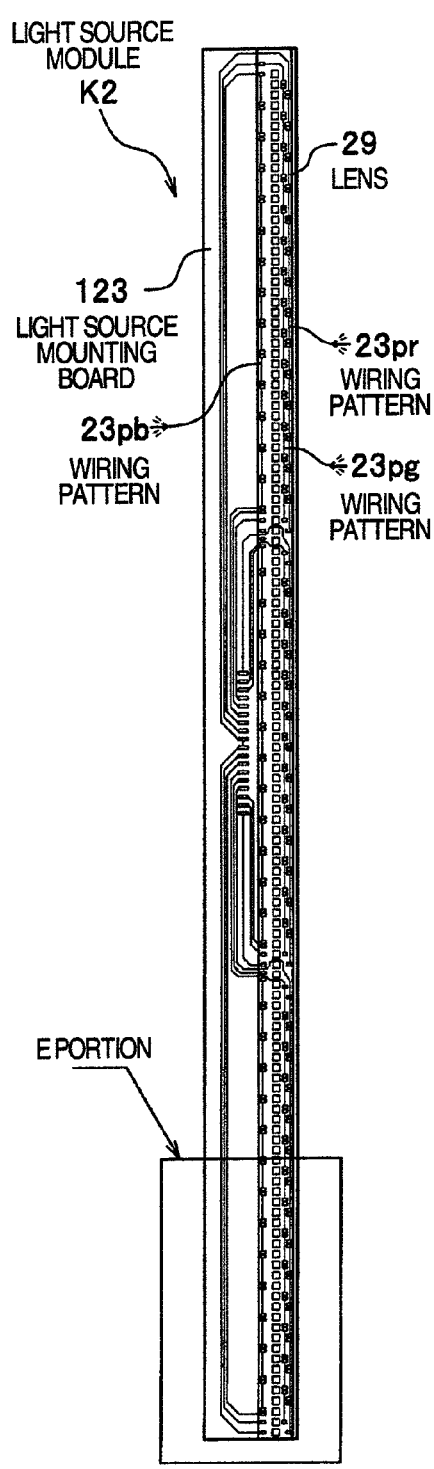
FIG. 9A is an upper surface conceptual diagram seeing the light source module from an upside in a second embodiment.
Figure 9B:
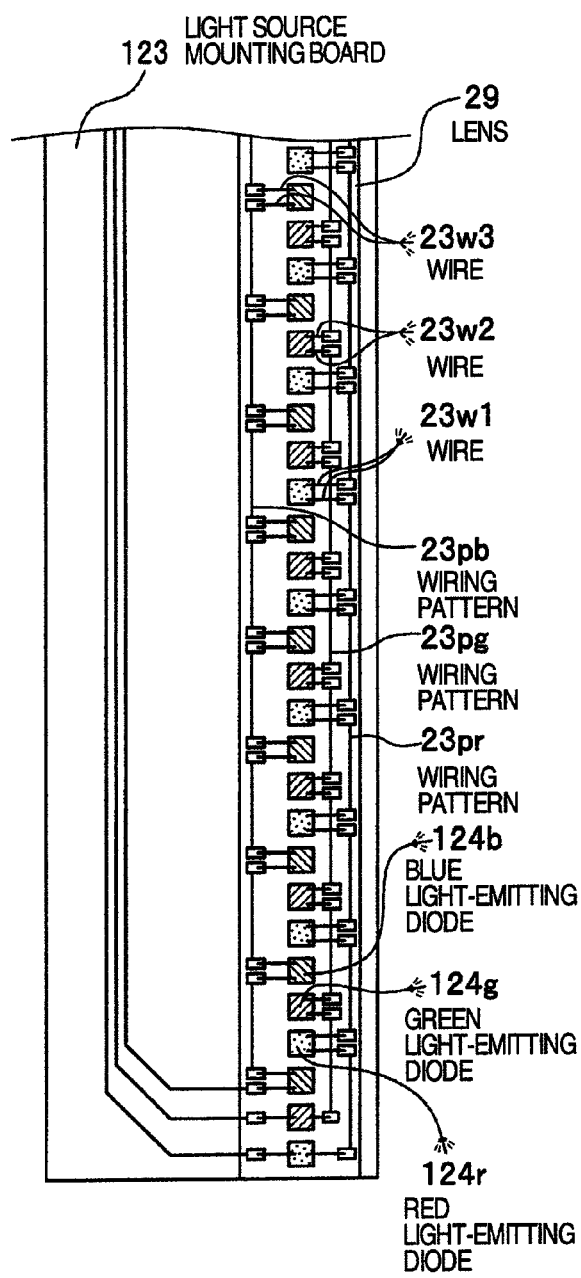
FIG. 9B is an enlarged view of E portion in FIG. 9A.

Next, a light source module K2 in a second embodiment of the invention will be described with use of FIGS. 9A and 9B. In addition, FIG. 9A is an upper surface conceptual diagram seeing the light source module K1 in FIG. 3A from an upside. FIG. 9B is an enlarged view of E portion in FIG. 9A and shows a wiring pattern to be connected with the light-emitting diodes 124 in the second embodiment. Further, in the second embodiment, reference numerals of the same constitutional elements in the first embodiment are changed to twenties digits from the tens digits in the first embodiment, and detailed description of the same is omitted.

The light source module K2 in the second embodiment in FIGS. 9A and 9B is shown that the respective wiring patterns 13p of the light source module K1 in the first embodiment shown in FIGS. 6A and 6B are made all linearly.

As shown in FIGS. 9A and 9B, the red light-emitting diode 124r, green light-emitting diode 124g and blue light-emitting diode 124b are set to one unit, and a plurality of the units are repeatedly and linearly mounted on the light source mounting board 123. The light-emitting diodes 124 are sealed by a lens (lens body) 29 using a resin extended to and exhibited a half cylindrical shape for a purpose of focusing the emitted light.

A wiring pattern 23pr to be connected with the red light-emitting diodes 124r is formed linearly along one side of the lens 29 in the longitudinal direction. The red light-emitting diodes 124r are then wire-bonded with the wiring pattern 23pr by using a wire 23w1, and the predetermined number of red light-emitting diodes 124r are connected in series. Likewise, a wiring pattern 23pg to be connected with the green light-emitting diodes 124g is formed linearly along the one side, in the longitudinal direction, in the lens 29 on the light source mounting board 123. The green light-emitting diodes 124g are wire-bonded with the wiring pattern 23pg by using a wire 23w2, and the predetermined number of green light-emitting diodes 124g are connected in series.

In contrast, the wiring pattern 23pb to be connected with the blue light-emitting diodes 124b is formed linearly along the other side in the longitudinal direction in the lens 29 mounted on the light source mounting board 123. The blue light-emitting diodes 124b are then wire-bonded with the wiring pattern 23pb by using a wire 23w3, and the predetermined number of blue light-emitting diodes 124b are connected in series.

According to the second embodiment, as shown in FIG. 9B, the wirings are intersected three-dimensionally with each other to prevent the wiring pattern from overlapping, and to be able to form wiring patterns 23p on a single layer wiring, since the connections of light-emitting diodes 124 are wire-boned with the wiring patterns 23p. In addition, the wiring pattern 23pr to be connected with the red light-emitting diodes 124r and the wiring pattern 23pg to be connected with the green light-emitting diodes 124g are formed linearly along the one side, in the longitudinal direction, in the lens 29 mounted on the light source mounting board 123, and the wiring pattern 23pb to be connected with the blue light-emitting diodes 124b is formed linearly along the other side, in the longitudinal direction, in the lens 29. Because of this, the length of wiring patterns 23p can be made shortest, and an occupied area thereof can be made minimized. Therefore, the occupied area of the alumina board having the high reflectance in the lens 29 is maximized to enhance the reflectance so that the light of light-emitting diodes 124, reflected in the lens 29, can be extracted effectively, further enhancing the luminance.

Embodiment 3

Figure 10A:
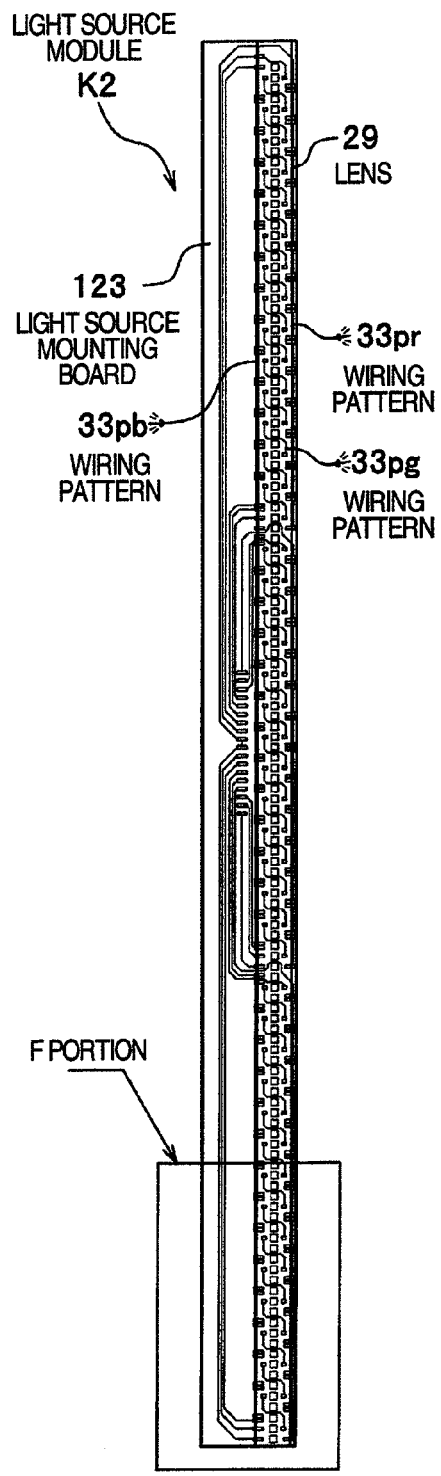
FIG. 10A is an upper surface conceptual diagram seeing the light source module from an upside in a third embodiment.
Figure 10B:
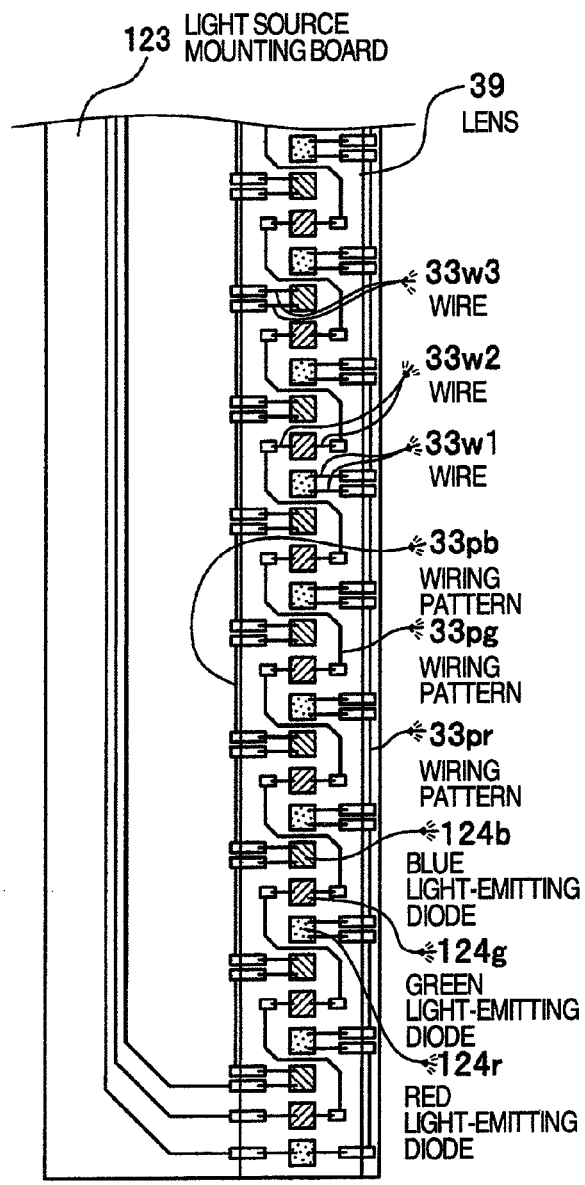
FIG. 10B is an enlarged view of F portion in FIG. 10A.

Next, a light source module K3 in a third embodiment of the invention will be described with use of FIGS. 10A and 10B. In addition, FIG. 10A is an upper surface conceptual diagram seeing the light source module in FIG. 3A from an upside, and FIG. 10B is an enlarged view of F portion in FIG. 10A and shows a wiring pattern connected with the light-emitting diode 124 in the third embodiment. Further, in the third embodiment, reference numerals of the same constitutional elements in the first embodiment are changed to thirties digits from the tens digits of the first embodiment, and detailed description of the same is omitted.

The light source module K3 in the third embodiment shown in FIGS. 10A and 10B is that the wiring patterns 13$pr$, 13$pb$ in the lens 19 of the light source module K in the first embodiment shown in FIGS. 6A and 6B are formed outside the lens 19.

That is, in the light source module K3 in the third embodiment, a wiring pattern 33$pr$ to be connected with the red light-emitting diodes 124$r$ is formed linearly on the light source mounting board 123 along the outside of a lens 39 in a longitudinal direction thereof, as shown in FIG. 10B. Likewise, a wiring pattern (wiring pattern defined in claim 9) 33$pb$ to be connected with the blue light-emitting diodes 124$b$ is formed linearly on the light source mounting board 123 along the outside of the lens (lens body) 39 in the longitudinal direction thereof.

According to the third embodiment, since the wiring pattern 33$pr$ connected with the red light-emitting diodes 124$r$ and the wiring pattern 33$pb$ connected with the blue light-emitting diodes 124$b$ are formed on the light source mounting board 123 outside the lens 39, an occupied area for the wiring pattern 33$pr$, 33$pb$ is disappeared inside the lens 39. Therefore, as shown in FIG. 5, an occupied area inside the lens 39 of the alumina board having the higher reflectance than the wiring pattern is expanded considerably large. For this reason, the light of the light-emitting diodes 124 reflected inside the lens 39 can be extracted quite effectively, so that the enhancement of luminance can be made high.

Embodiment 4

Next, a light source module K4 in a fourth embodiment of the invention will be described with use of FIGS. 11A and 11B. In addition, FIGS. 11A to 11B are conceptual section diagrams showing connections between the light-emitting diodes 124 and the wiring patterns formed on the light source mounting board 123. Further, in the fourth embodiment, reference numerals of the same constitutional elements in the first embodiment are changed to forties digits from the tens digits of the first embodiment, and detailed description of the same is omitted.

In the fourth embodiment shown in FIG. 11A, a wiring pattern (wiring pattern defined in claim 4) 43$p2$ to be formed on the light source mounting board 123 is formed by silver having high reflectance (referring to FIG. 5). A gold connecting portion (connecting portion defined in claim 4) 43$p1$ having a good connectivity of a predetermined area is formed on the wiring pattern 43$p2$, a partial place of which is wire-bonded with the light-emitting diodes 124, and the connection portion 43$p1$ is then wire-bonded.

According to the constitution in FIG. 11A, in a wiring pattern 43$p$, the connecting portion 43$p1$ which is necessary for a connecting reliability and is wire-bonded, is made of gold having the good connectivity, and the wiring pattern 43$p2$ of the connecting portion having a large occupied area between the light-emitting diode 124 to be necessary for the reflectance is made of silver having the high reflectance. Thus, it is possible to simultaneously realize the connecting reliability and the enhancement of extracting the light effectively.

In the case of the fourth embodiment shown in FIG. 11B, a gold wiring pattern (wiring pattern defined in claim 5) 43$p3$ having the good connectivity is formed on the light source mounting board 123. In contrast, as is apparent from FIG. 5, gold has a difficulty in the reflectance responsive to the blue light. Therefore, an organic film (reflection layer defined in claim 5) 43$p4$, for example, a white resin having a higher reflectance than the gold wiring pattern 43$p3$ is formed on the connecting portion having the large occupied area of the wiring pattern 43$p3$.

According to the constitution in FIG. 11B, since the wiring pattern 43$p3$ at the wire bonding portion is made of gold having the good connecting reliability, the connecting reliability necessary for the wire bonding portion can be obtained. On the contrary, the connecting portion of the wiring pattern 43$p3$ having the large occupied area necessary for the reflectance forms the organic film 43$p4$ having the high reflectance, therefore, it is possible to realize simultaneously the connecting reliability and the enhancement of extracting the light effectively.

Embodiment 5

Next, a light source module K5 in a fifth embodiment of the invention will be described with use of FIG. 12. In addition, FIG. 12 is a conceptual section diagram showing a formation of a wiring pattern 53$p$ formed on the light source mounting board 123, and connections between the wiring pattern 53$p$ and the light-emitting diode 124. Further, in the fifth embodiment, reference numerals of the same constitutional elements in the first embodiment are changed to fifties digits from the tens digits of the first embodiment, and detailed description of the same is omitted.

In the fifth embodiment, silver having the high reflectance (referring to FIG. 5) is formed as a first layer wring pattern 53$p1$ to be formed on the light source mounting board 123, as shown in FIG. 12, and a gold connecting portion 53$p2$ having the good connectivity is formed on the wiring pattern 53$p1$ of the wire bonding portion necessary for the connecting reliability.

Further, since a wiring pattern outside a lens (lens body) 59 is subject to a corrosion which progresses rapidly because of contacting the air, a gold protecting layer (protecting layer defined in claim 10) 53$p3$ having a low hygroscopic property is formed on the sliver wiring pattern (wiring pattern defined in claim 10) 53$p1$ having a high hygroscopic property.

According to the constitution in the fifth embodiment, the connecting reliability necessary for the wire-bonding portion can be obtained since the gold connection portion 53$p2$ having the high connecting reliability is formed on the wire-bonding portion. The wiring portion of wiring pattern 53$p1$ having the large occupied area necessary for the reflectance is formed by sliver having the high reflectance. For this reason, it is possible to realize simultaneously the connecting reliability and the enhancement of extracting the light effectively. In addition, it is possible to prevent a wiring corrosion in advance and to enhance reliability, since the gold protecting layer 53$p3$ having the low hygroscopic property is formed on wiring pattern 53$p1$ in contact with the outside air of the lens 59.

In addition, it is possible to form the gold connecting portion 53$p2$ on the wiring pattern 53$p1$ inside the lens 59 and the gold protecting layer 53$p3$ on the wiring pattern 53$p1$ outside the lens 59 by the same processing step.

Embodiment 6

Figure 13A:
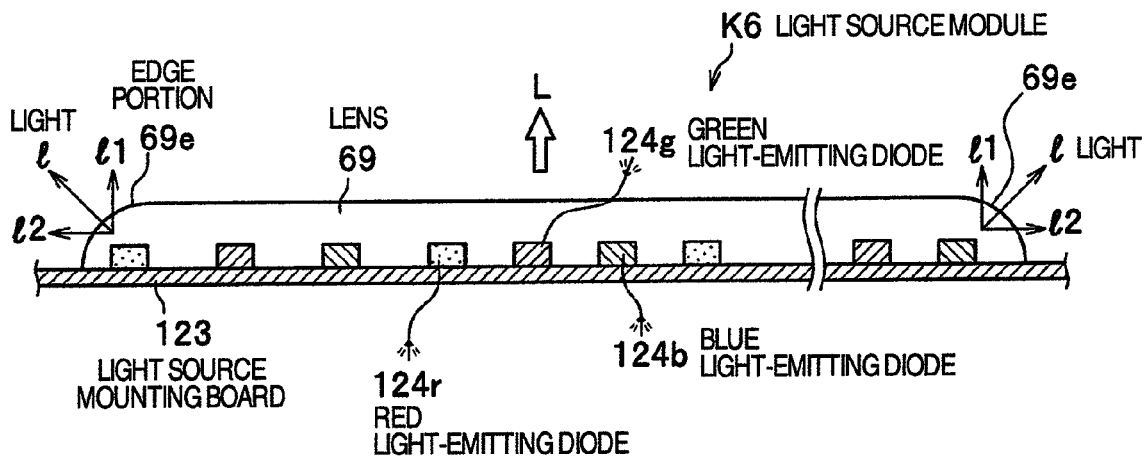
FIGS. 13A to 13C are section conceptual diagrams indicated by the arrows F-F in FIG. 3A showing the light source module in a sixth embodiment.
Figure 13B:
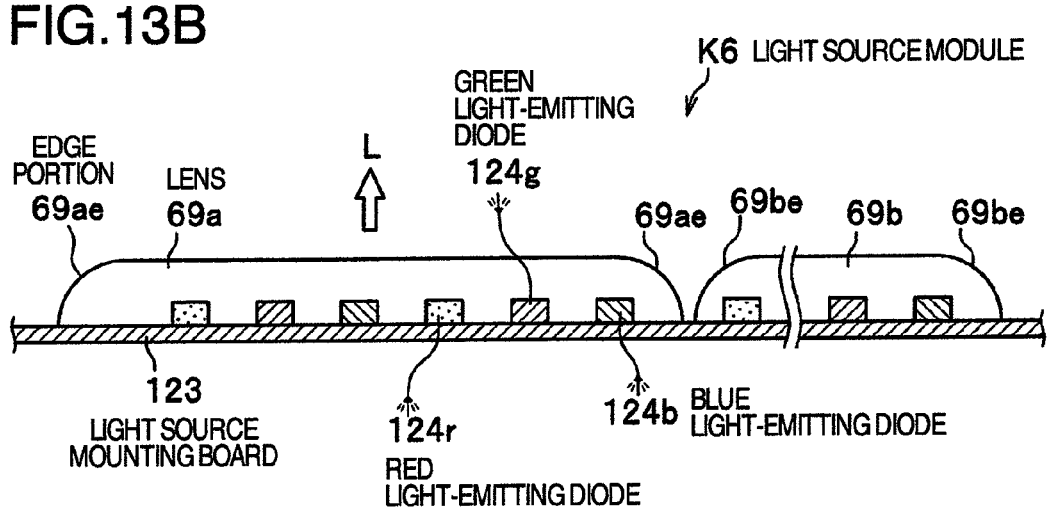
Figure 13C:
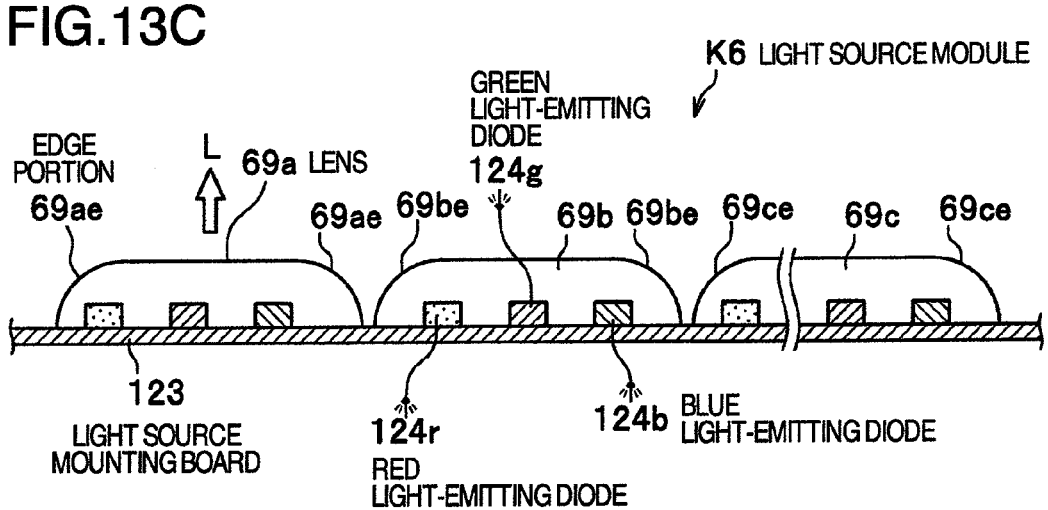

Next, a light source module K6 in a sixth embodiment of the invention will be described with use of FIGS. 13A to 13C. In addition, FIGS. 13A to 13C are section conceptual diagrams indicated by the arrows F-F in FIG. 3A showing the light source module K6 in the sixth embodiment. In the sixth embodiment, reference numerals of the same constitutional elements in the first embodiment are changed to sixties digits from the tens digits of the first embodiment, and detailed description of the same is omitted.

As shown in FIG. 2B, it is necessary to obtain a light of a component directed to a light guide plate 121 in an L direction in order to utilize effectively a light of the light source module K6.

In the case of the light source module K6 shown in FIG. 13A, edge portions 69e, 69e formed on both end portions of a lens (lens body defined in claim 11) 69 are formed of rounds each having a curvature facing to the light guide plate 121 which is in the L direction to which the light is transmitted. Because of this, lights l, l irradiated on the edge portions 69e, 69e of the light-emitting diodes 124r, 124g and 124b mounted on the light source mounting board 123 become lights ll, ll of the component in the L direction at the edge portions 69e, 69e.

According to the constitution shown in FIG. 13A, since the edge portions (edge portions defined in claim 11) 69e, 69e of the lens 69 are formed of the rounds each having the curvature facing to the light guide plate 121 which is in the L direction to which the light is transmitted, it is possible to increase an amount of light to be entered into the light guide plate 4 at the edge portions 69e, 69e, therefore, the light can be extracted in high efficiency, enhancing the luminance.

In the case of the light source module K6 shown in FIG. 13B, the light-emitting diodes 124 are divided into lens (lens body defined in claim 12) 69a, 69b, . . . , each of which is sealed, and each of the lens 69a, 69b, . . . contains two pieces for each of the red, blue and green light-emitting diodes. That is, each of the lens 69a, 69b, . . . contains six pieces of the light-emitting diodes and is formed of the rounds each having a curvature at edge portions 69ae, 69ae, . . . .

Further, in the case of the light source module K6 shown in FIG. 13C, the light-emitting diodes 124 are divided into lens (lens body defined in claim 12) 69a, 69b, . . . , each of which is sealed, and each of the lens 69a, 69b, . . . contains one piece for each of the red, blue and green light-emitting diodes. That is, each of the lens 69a, 69b, . . . contains three pieces of the light-emitting diodes. Edge portions (edge portion defined in claim 11) 69ae, 69ae, 69be, 69be, 69ce, 69ce, . . . of the respective lens 69a, 69b, 69c are faced to the light guide plate 121 which is in the L direction to which the light is transmitted, and are formed of the rounds each having a curvature.

According to the constitution in the sixth embodiment shown in FIGS. 13B and 13C, in the case where the number of divided lens is set increasingly to a certain number, the light component in the L direction or the light to be entered into the light guide plate 4 can be obtained more if the edge portions of the respective lens are formed of the rounds, so that the light can be extracted in high efficiency. In addition, the sixth embodiment has been described with an example where the edge portions of the lens are formed of the rounds, but it is not limited to form the rounds at the edge portions. The edge portions may respectively have curvatures facing to the light guide plate 121 in the L direction to which the light is transmitted.

In addition, the first to sixth embodiments have been described with the light source module K as examples where the light-emitting diodes are sealed by the lens using the resin, but it is possible to employ a light source module which does not use the lens.

In this case, a lighting system and a liquid crystal display using the lighting system can also be realized to be able to enhance a color purity of displayed image and to display a vivid image.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A lighting system having light-emitting diodes as light sources mounted on a circuit board, wherein
the light-emitting diodes include a first light-emitting diode, a second light-emitting diode and a third light-emitting diode, the first, second and third light-emitting diodes being different color light-emitting diodes,
the light-emitting diodes are constituted of one single unit including one for each of the first, second and third light-emitting diodes, and the one single unit is repeatedly arranged as plural single units mounted side by side on the same circuit board, and
each of the first, second and third light-emitting diodes of one single unit is individually connected electrically to the first, second and third light-emitting diodes of the same color of another single unit to emit a light,
wherein a first wiring pattern enables connection of one of the first, second and third light-emitting diodes of the plural single units and has at least one portion formed linearly on the same circuit board along a mounting direction of the light-emitting diodes of the plural single units so as to extend only along a first side of the circuit board, and
wherein a second wiring pattern enables connection of another of the first, second and third light-emitting diodes of the plural single units and has at least one portion formed linearly on the same circuit board along the mounting direction of the light-emitting diodes of the plural single units so as to extend only along a second side of the circuit board, the second side of the circuit board being opposite to the first side of the circuit board.

2. The lighting system according to claim 1, wherein a reflecting layer having a higher reflectance than a reflectance of the first and second wiring patterns is formed on the first and second wiring patterns connected with the light-emitting diodes.

3. The lighting system according to claim 1, wherein the circuit board includes an alumina board.

4. The lighting system according to claim 1, wherein a number of the light-emitting diodes connected electrically with individual colors is set such that a drive voltage for the diodes is equal to a supply voltage to the circuit board.

5. The lighting system according to claim 1, further comprising a transparent lens body that covers over the light-emitting diodes, focuses a light from the light-emitting diode, and leads the light in an irradiating direction.

6. The lighting system according to claim 5, wherein a wiring pattern connected with the light-emitting diode is formed outside the lens body.

7. The lighting system according to claim 6, wherein a protecting layer having a higher corrosion resistivity than the wiring pattern is formed on the wiring pattern outside the lens body.

8. The lighting system according to claim 5, wherein an edge portion of the lens body is formed of a shape having a curvature.

9. The lighting system according to claim 8, wherein the lens body is formed dividedly into plural pieces in the mounting direction of the light-emitting diodes of the one single unit.

10. A liquid crystal display comprising:
a liquid crystal panel which displays an image; and
the lighting system according to claim 1.

11. The light system according to claim 1, wherein the one single unit includes the first, third and second light-emitting diodes as red, blue and green light-emitting diodes respectively arranged side by side along the mounting direction of the light-emitting diodes on the circuit board.

12. The liquid crystal display device according to claim 10, wherein the one single unit includes the first, third and second light-emitting diodes as red, blue and green light-emitting diodes respectively arranged side by side along the mounting direction of the light-emitting diodes on the circuit board.

13. The liquid crystal display device according to claim 1, wherein a third wiring pattern enables connection of a further of the first, second and third light-emitting diodes of the plural single units and has one portion formed linearly on the same circuit board along the mounting direction of the light-emitting diodes of the plural single units along the first side of the circuit board, another portion formed linearly along the second side of the circuit board, and a further portion connecting the one portion and the another portion and extending between adjacent single units of the circuit board.

14. The liquid crystal display device according to claim 13, wherein the first wiring pattern enables connection of red light-emitting diodes, the second wiring pattern enables connection of green light-emitting diodes, and the third wiring pattern enables connection of blue light-emitting diodes.

15. The liquid crystal display device according to claim 14, wherein the first, second and third wiring patterns are connected with respective light-emitting diodes by a wire bonding.

16. The liquid crystal display device according to claim 13, wherein wirings of the first, second and third wiring patters are intersected three-dimensionally.

* * * * *